(12) United States Patent
Bi et al.

(10) Patent No.: US 12,160,218 B2
(45) Date of Patent: *Dec. 3, 2024

(54) RESONATOR SHAPES FOR BULK ACOUSTIC WAVE (BAW) DEVICES

(71) Applicant: Akoustis, Inc., Huntersville, NC (US)

(72) Inventors: Zhiqiang Bi, Mooresville, NC (US);
Dae Ho Kim, Cornelius, NC (US);
Pinal Patel, Charlotte, NC (US); Kathy W. Davis, Stanley, NC (US); Rohan W. Houlden, Oak Ridge, NC (US)

(73) Assignee: AKOUSTIS, INC., Huntersville, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/064,762

(22) Filed: Dec. 12, 2022

(65) Prior Publication Data
US 2023/0112046 A1 Apr. 13, 2023

Related U.S. Application Data

(63) Continuation of application No. 16/389,818, filed on Apr. 19, 2019, now Pat. No. 11,552,613.

(51) Int. Cl.
*H03H 9/02* (2006.01)
*H03H 9/05* (2006.01)
(Continued)

(52) U.S. Cl.
CPC ...... *H03H 9/02031* (2013.01); *H03H 9/0514* (2013.01); *H03H 9/105* (2013.01);
(Continued)

(58) Field of Classification Search
CPC .. H03H 9/02031; H03H 9/0514; H03H 9/105; H03H 9/132; H03H 9/174; H03H 9/176; H03H 9/562; H03H 9/564
(Continued)

(56) References Cited

U.S. PATENT DOCUMENTS 11,552,613 B2 * 1/2023 Bi ...................... H03H 9/02015
2005/0146242 A1 7/2005 Inoue
(Continued)

FOREIGN PATENT DOCUMENTS

JP 2005184303 7/2005

OTHER PUBLICATIONS

"Research finally reveals ancient universal equation for the shape of an egg", published in the University of Kent News center by Sam Wood in Aug. 31, 2021 (Year: 2021).*
(Continued)

*Primary Examiner* — Hafizur Rahman

(57) ABSTRACT

A resonator circuit device. The present invention provides for improved resonator shapes using egg-shaped, partial egg-shaped, and asymmetrical partial egg-shaped resonator structures. These resonator shapes are configured to give less spurious mode/noise below the resonant frequency ($F_s$) than rectangular, circular, and elliptical resonator shapes. These improved resonator shapes also provide filter layout flexibility, which allows for more compact resonator devices compared to resonator devices using conventionally shaped resonators.

10 Claims, 11 Drawing Sheets

(51) Int. Cl.
  *H03H 9/10* (2006.01)
  *H03H 9/13* (2006.01)
  *H03H 9/17* (2006.01)
  *H03H 9/56* (2006.01)
(52) U.S. Cl.
  CPC ............ *H03H 9/132* (2013.01); *H03H 9/174* (2013.01); *H03H 9/176* (2013.01); *H03H 9/562* (2013.01); *H03H 9/564* (2013.01)
(58) Field of Classification Search
  USPC ........................................................ 310/360
  See application file for complete search history.

(56) References Cited

U.S. PATENT DOCUMENTS

| | | |
|---|---|---|
| 2006/0244553 A1 | 11/2006 | Yokoyama et al. |
| 2007/0252662 A1 | 11/2007 | Nishihara et al. |
| 2010/0156565 A1 | 6/2010 | Oka et al. |
| 2012/0229223 A1 | 9/2012 | Il et al. |
| 2016/0190426 A1 | 6/2016 | Kobayashi |
| 2018/0277739 A1* | 9/2018 | Tajic ........................ H03H 3/02 |
| 2019/0044493 A1 | 2/2019 | Kim et al. |
| 2019/0089332 A1 | 3/2019 | Menendez-Nadal et al. |
| 2019/0199312 A1* | 6/2019 | Dasgupta ................. H03H 3/02 |
| 2019/0356301 A1* | 11/2019 | Yoon .................. H03H 9/02047 |

OTHER PUBLICATIONS

Mahdavi et al., "Thin film Piezoelectric-on-Silicon Elliptical Resonators with low liquid phase motional resistances", IEEE Sensors Journal, Oct. 2018. (Year: 2018).*

International Search Report and Written Opinion for PCT/US2018/045064 filed Aug. 2, 2018.

International Search Report and Written Opinion for PCT/US2020/028292 filed Jul. 24, 2020.

* cited by examiner

RESONATOR SHAPES FOR BULK ACOUSTIC WAVE (BAW) DEVICES

RELATED APPLICATIONS

This application claims priority to and is a continuation of U.S. patent application Ser. No. 16/389,818, filed Apr. 19, 2019, which is incorporated by reference herein in its entirety. The present application also incorporates by reference, for all purposes, the following U.S. patent application Ser. No. 16/054,929 titled "ELLIPTICAL STRUCTURE FOR BULK ACOUSTIC WAVE RESONATOR", filed Aug. 3, 2018.

BACKGROUND OF THE INVENTION

The present invention relates generally to electronic devices. More particularly, the present invention provides techniques related to a method of manufacture and a structure for bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

With 4G LTE and 5G growing more popular by the day, wireless data communication demands high performance RF filters with frequencies around 5 GHz and higher. Bulk acoustic wave resonators (BAWR) using crystalline piezoelectric thin films are leading candidates for meeting such demands. Current BAWRs using polycrystalline piezoelectric thin films are adequate for bulk acoustic wave (BAW) filters operating at frequencies ranging from 1 to 3 GHz; however, the quality of the polycrystalline piezoelectric films degrades quickly as the thicknesses decrease below around 0.5 um, which is required for resonators and filters operating at frequencies around 5 GHz and above. Single crystalline or epitaxial piezoelectric thin films grown on compatible crystalline substrates exhibit good crystalline quality and high piezoelectric performance even down to very thin thicknesses, e.g., 0.4 um. Even so, there are challenges to using and transferring piezoelectric thin films in the manufacture of BAWR and BAW filters.

From the above, it is seen that techniques for improving methods of manufacture and structures for acoustic resonator devices are highly desirable.

BRIEF SUMMARY OF THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

The present invention provides for resonator circuit having improved resonator shapes by using egg-shaped, partial egg-shaped, and asymmetrical partial egg-shaped resonator structures. The resonator circuit includes at least a top electrode, a piezoelectric layer, and a bottom electrode. In an example, the electrodes and the piezoelectric layer are characterized by an oval shape with only a single axis of symmetry, such as an egg-shaped outline. This shape can consist of a first half characterized by half of an elongated or flattened oval and a second half characterized by half of a substantially circular shape. The shape can also be a skewed asymmetrical egg-shape, a portion of the previously described oval shape, or even a combination shape of half a circle connected to a quadrilateral. Those of ordinary skill in the art will recognize other variations, modifications, and alternatives.

In an example, the portion of the oval shape can be characterized by a first portion remaining after the removal of a second portion at an angle $\alpha$ from an axis perpendicular to the axis of symmetry. In a specific example, this angle $\alpha$ ranges from about −30 degrees to about 30 degrees. Also, the top electrode and bottom electrode include molybdenum (Mo), ruthenium (Ru), tungsten (W), or aluminum-copper (AlCu), or the like and combinations thereof. And, the piezoelectric layer includes materials or alloys having at least one of the following: AlN, AlGaN, GaN, InN, InGaN, AlInN, AlInGaN, ScAlN, ScGaN, AlScYN, and BN.

One or more benefits are achieved over pre-existing techniques using the invention. In particular, the present invention also provides for improved resonator shapes configured to give less spurious mode/noise below the resonant frequency ($F_s$) than rectangular, circular, and elliptical resonator shapes. These improved resonator shapes also provide filter layout flexibility, which allows for more compact resonator devices compared to conventional examples. Further, the present device can be manufactured in a relatively simple and cost effective manner while using conventional materials and/or methods according to one of ordinary skill in the art. Depending upon the embodiment, one or more of these benefits may be achieved.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

Generally, a Bulk Acoustic Wave (BAW) resonator is a parallel plate capacitor which can be characterized by the geometrical shape of its metal plates and the thickness and composition of the piezoelectric material between the two electrodes of the capacitor. A configuration of such resonators can be used to create an RF filter creating a signal passband that is characterized by the insertion loss (known as "S21"), which describes the impact of placing the filter in an RF circuit.

The shape of a BAW resonator determines the strength of lateral mode/noise. Conventional resonators are typically constructed using polygons with N-number of sides (where N≥3). Circular-shaped resonators are possible, but typically offer undesirable symmetry, which leads to undesirable modes in the resonator. Elliptically-shaped resonators, such as the one shown in FIGS. 1A and 1B, exhibit weaker lateral mode noise than circular shapes and rectangular shapes. However, the lateral mode spurious is still strong in elliptical resonators, especially below the series resonant frequency ($F_s$). These strong lateral modes will introduce ripples in the filter passband and cause the insertion loss in a filter to become worse.

Figure 1A:
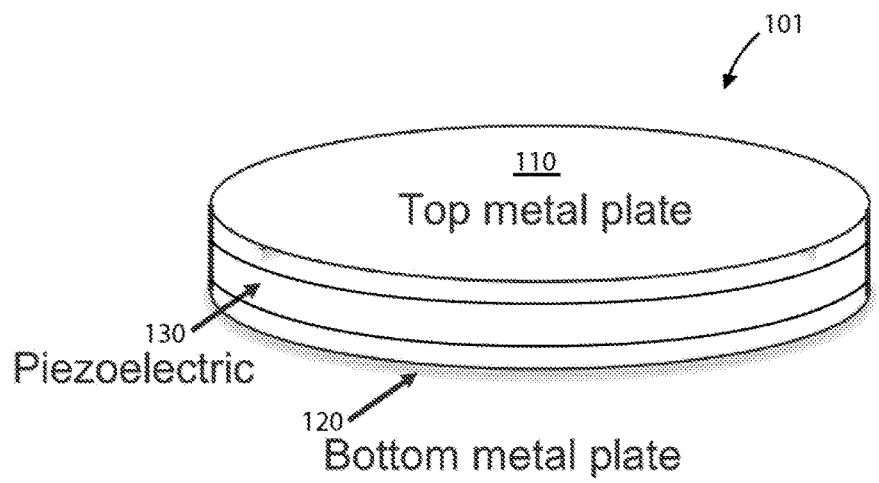
FIGS. 1A and 1B are simplified diagrams illustrating a side view and top view, respectively, for a prior art elliptical-shaped resonator device.
Figure 1B:
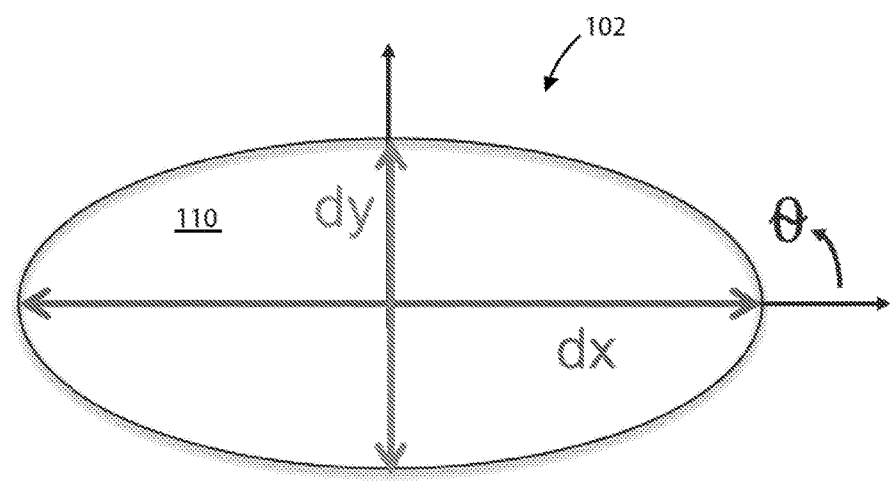

FIG. 1A is a simplified diagram illustrating a side "sandwich" view of an elliptical-shaped resonator according to a prior art example. As shown, device 101 includes a top metal plate 110 and bottom metal plate 120 that sandwich a piezoelectric layer 130. Elliptical-shaped resonators can be constructed with a ratio, defined as R, of the horizontal diameter (dx) to vertical diameter (dy) of the resonator, where R=dx/dy. Once defined with R, the resonator can be placed in an RF circuit at an arbitrary angle theta ($\theta$). FIG. 1B is a simplified diagram illustrating a top view of the same elliptical-shaped resonator according an example of the present invention. Here, device 102 only shows the top metal plate 110, but the previously discussed measurements of the horizontal diameter (dx), vertical diameter (dy), and angle theta ($\theta$) are shown in reference to the top metal plate 110.

Figure 2C:
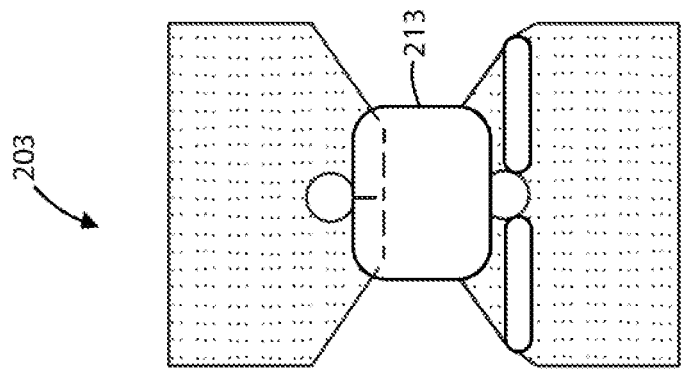
FIG. 2C is a simplified diagram illustrating a rectangular-shaped resonator according to a prior art example.
Figure 2B:
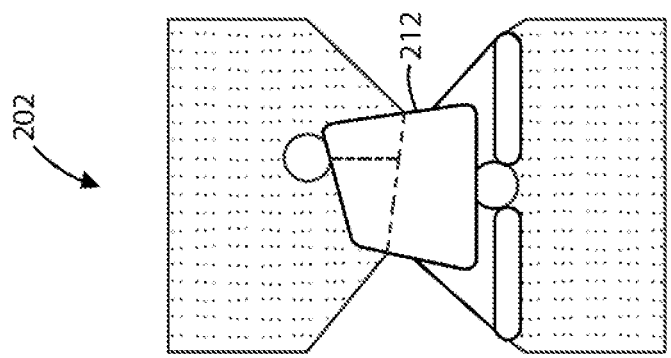
FIG. 2B is a simplified diagram illustrating a quadrilateral-shaped resonator according to a prior art example.
Figure 2A:
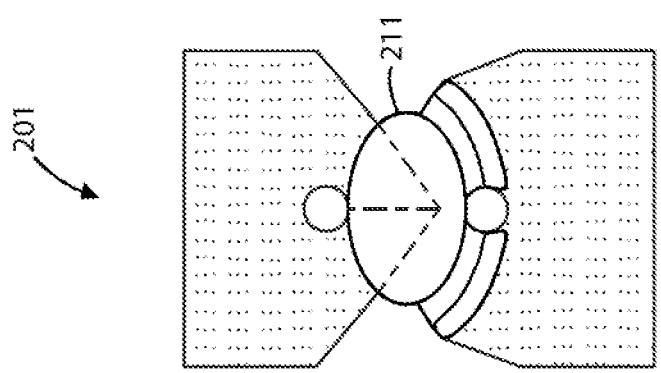
FIG. 2A is a simplified diagram illustrating an elliptical-shaped resonator according to a prior art example.

FIG. 2A is a simplified diagram illustrating an elliptical-shaped resonator according to a prior art example. As shown, device 201 includes a flattened elliptical-shaped resonator 211, similar to the resonators of FIGS. 1A and 1B. As discussed previously, elliptical-shaped resonators exhibit weaker (i.e., improved) lateral mode noise than circular shapes and rectangular shapes, but the lateral mode spurious is still strong in elliptical resonators, especially below the series resonant frequency ($F_s$).

FIG. 2B is a simplified diagram illustrating a quadrilateral-shaped resonator according to a prior art example. As shown, device 202 includes a resonator 212 configured in an irregular quadrilateral shape. As discussed previously, such polygon-shaped resonators suffer from greater lateral mode noise compared to elliptical-shaped resonators.

FIG. 2C is a simplified diagram illustrating a rectangular-shaped resonator according to a prior art example. As shown, device 203 includes a rounded rectangular-shaped resonator 213. Similar to the quadrilateral-shaped resonator of FIG. 2B, such rectangular resonators suffer from greater lateral mode noise compared to elliptical-shaped resonators.

The present invention provides methods and structures for improved resonator shapes configured to give less spurious mode/noise below the resonant frequency ($F_s$) than rectangular, circular, and elliptical resonator shapes. These improved resonator shapes also provide filter layout flexibility, which allows for more compact resonator devices compared to conventional examples.

Figure 3C:
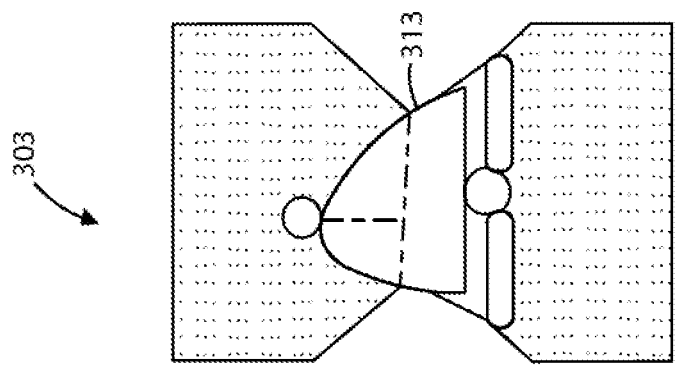
FIGS. 3A-3C are simplified diagrams illustrating egg-shaped resonators according to various example of the present invention.
Figure 3B:
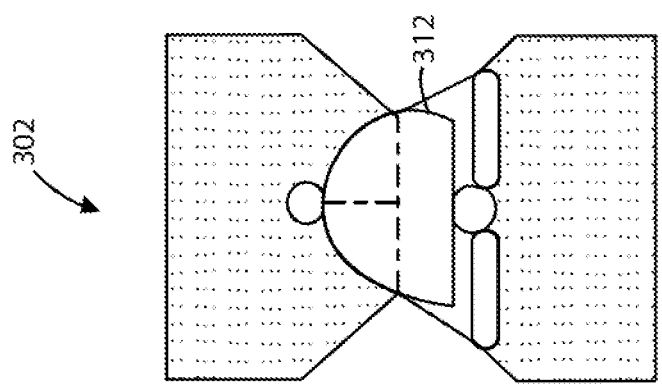
Figure 3A:
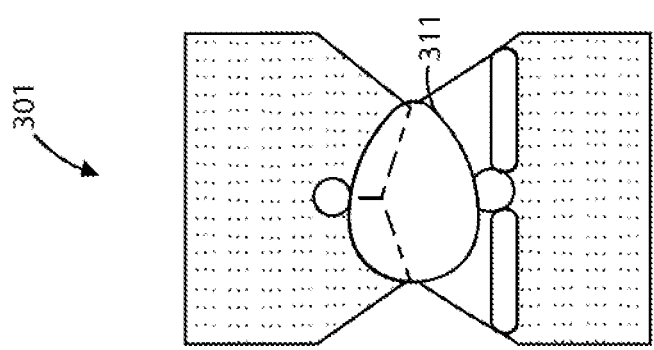

FIGS. 3A-3C are simplified diagrams illustrating egg-shaped resonators according to various example of the present invention. FIG. 3A depicts a device 301 including a full egg-shaped resonator 311. In an example, this egg shape can be defined by an oval shape with only one axis of symmetry (i.e., horizontal axis of FIG. 3A, or otherwise the axis running from the top of the egg outline to the bottom of the egg outline). The egg shape can also be defined by a first (top) half and a second (bottom) half. The first half can be characterized by a half of an elongated or flattened oval (i.e., a tapered end). The second half can be characterized by a half of a substantially circular shape (i.e., a non-tapered end).

FIGS. 3B and 3C depict devices with resonators having shapes characterized by a portion of an egg-shape as discussed for FIG. 3A. As discussed previously, these can be portions of an oval shape with only a single axis of symmetry, or portions of a shape having a tapered first half and a rounded second half. Specifically, FIG. 3B depicts a device 302 having a resonator 312 shaped like an egg with a portion of the tapered end cut off. The remaining portion presents as the rounded end rotated at an angle. In contrast, FIG. 3C depicts a device 303 having a resonator 313 shaped like an egg with a portion of the rounded end cut off. In this case, the remaining portion presents as the tapered end rotated at an angle, appearing to be the complementary portion of the egg shape of resonator 312. The angle of the cut (denoted α) can be measured from an axis perpendicular to the axis of symmetry. In a specific example, the angle α can range from about −30 degrees to about 30 degrees. Those of ordinary skill in the art will recognize other variations, modifications, and alternatives.

Figure 4C:
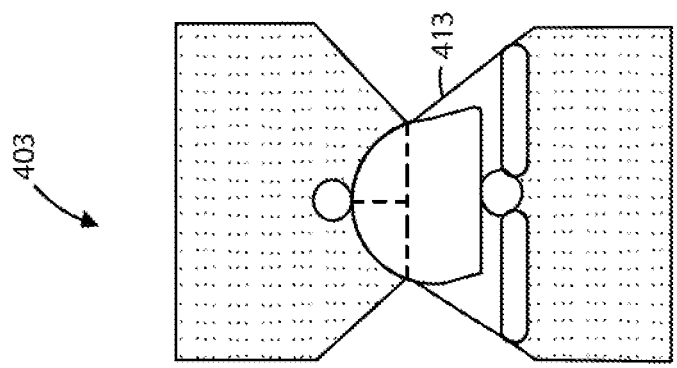
FIGS. 4A-4C are simplified diagrams illustrating asymmetrically-shaped resonators according to various examples of the present invention.
Figure 4B:
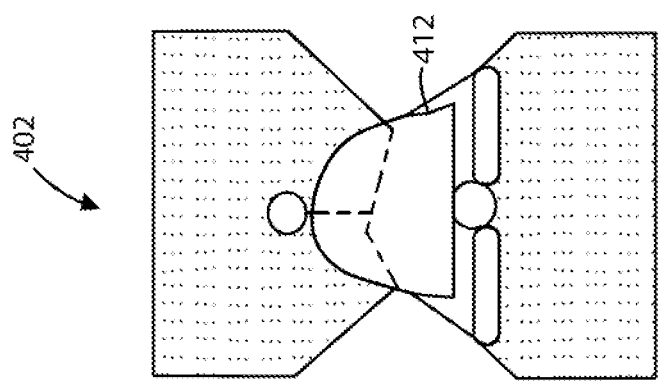
Figure 4A:
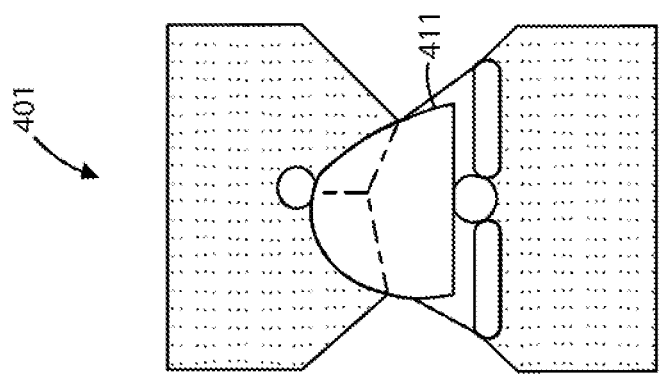

FIGS. 4A-4C are simplified diagrams illustrating asymmetrically-shaped resonators according to various examples of the present invention. More specifically, FIGS. 4A and 4B depict portions of asymmetrical oval or egg shapes while FIG. 4C depicts a combination or hybrid shape. FIGS. 4A and 4B depict devices 401 and 402, respectively, having resonators 411, 412, with shapes that resemble the cut portions of the resonators in FIGS. 3B and 3C. However, the shapes of resonators 411 and 412 are also subject to a skew or manipulation of the shape outline. Similarly, the angle of the cut (denoted α) for these asymmetrical egg shapes can also be measured from an axis perpendicular to the axis of symmetry. In a specific example, this angle α can range from about −30 degrees to about 30 degrees.

FIG. 4C depicts a device 403 having a resonator 413 with a shape that resembles combination of a half-circle connected to a right-slanting trapezoid on the flat-side of the half-circle. In this case, the quadrilateral is a right-slanting trapezoid. These shapes can be further modified by skew or manipulation like the resonators 411 and 412.

Figure 5C:
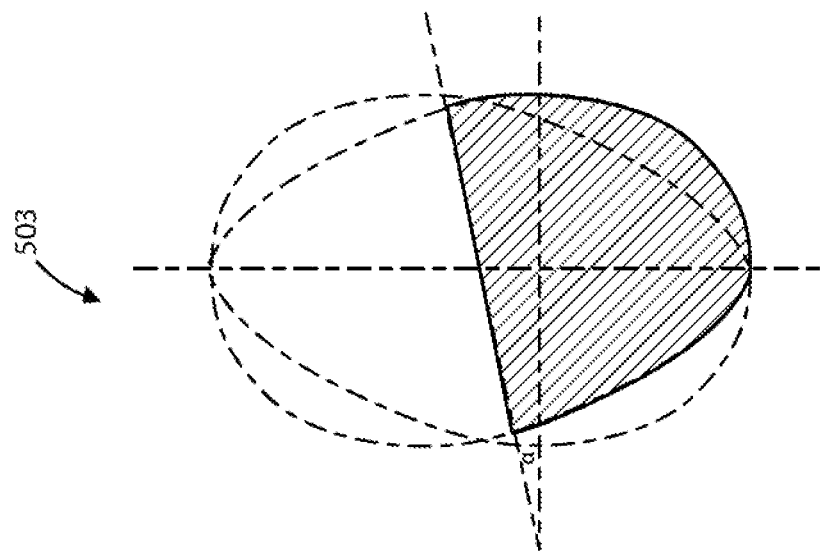
FIGS. 5A-5C are simplified diagrams illustrating asymmetrically-shaped resonators according to various examples of the present invention.
Figure 5B:
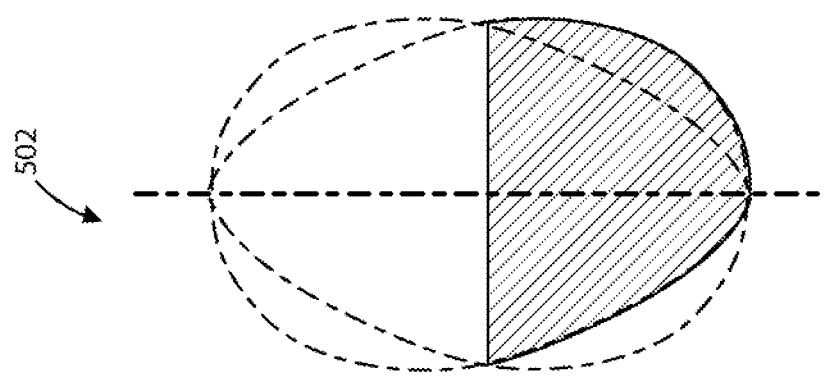
Figure 5A:
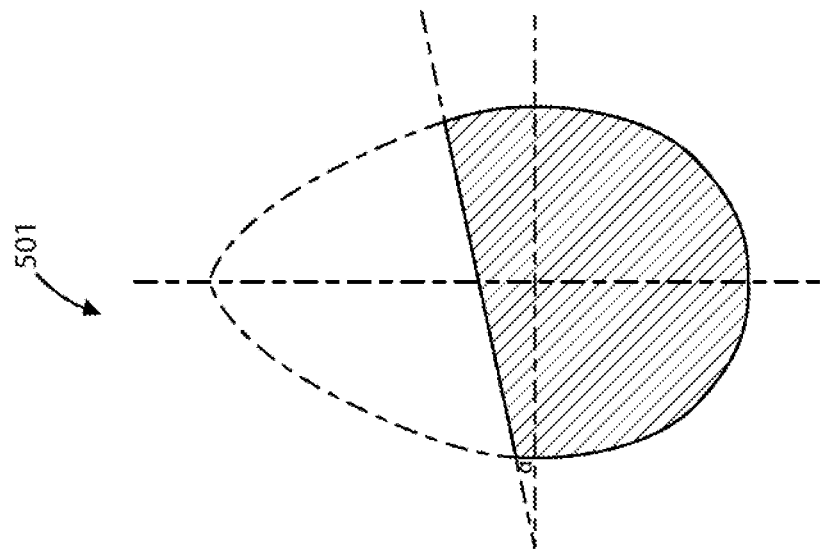

FIGS. 5A-5C are simplified diagrams illustrating asymmetrically-shaped egg resonators according to various examples of the present invention. FIG. 5A shows a resonator 501, which is similar to part-of-egg-shaped resonator 312. Angle α is shown as a reference to the portion cut away from the full outline of an egg-shaped resonator. FIG. 5B shows a resonator 502, which is similar to the asymmetrically-shaped resonators 411 and 412. Here, the asymmetrical shape characterized by a portion removed from the bottom half of an egg shape. This portion can be determined by superimposing an upside-down egg outline on the resonator 502 and identifying the region that falls outside of the superimposed outline (the bottom-left portion in this case). FIG. 5C shows a resonator 503 that is similar to resonator 502 with the addition of the angled cut according to angle α, which can also range from about −30 degrees to about 30 degrees.

Figure 6:
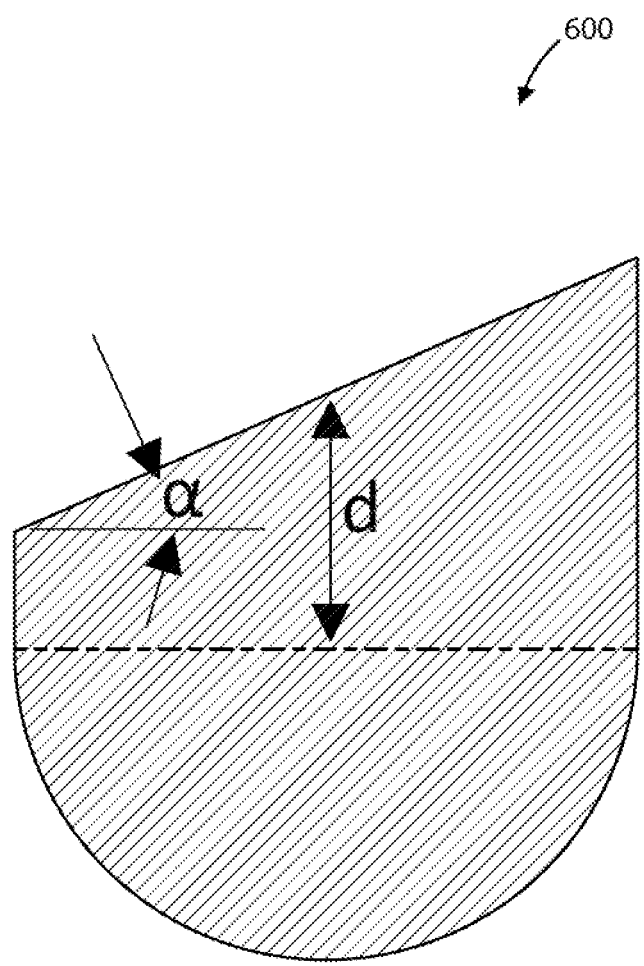
FIG. 6 is a simplified diagram illustrating an asymmetrical-shaped resonator according to an example of the present invention.

FIG. 6 is a simplified diagram illustrating an asymmetrical-shaped resonator according to an example of the present invention. As shown, resonator 600 is an alternative version of the combination shape previously discussed for FIG. 4C. Here, the quadrilateral portion has a short side and a long side (with a mid-point length of d) perpendicular to the axis parallel to the flat side of the semi-circle. The side of the quadrilateral opposite to the side coupled to the semi-circle is slanted at an angle α, which can range from about −30 degrees to about 30 degrees as well.

Figure 7:
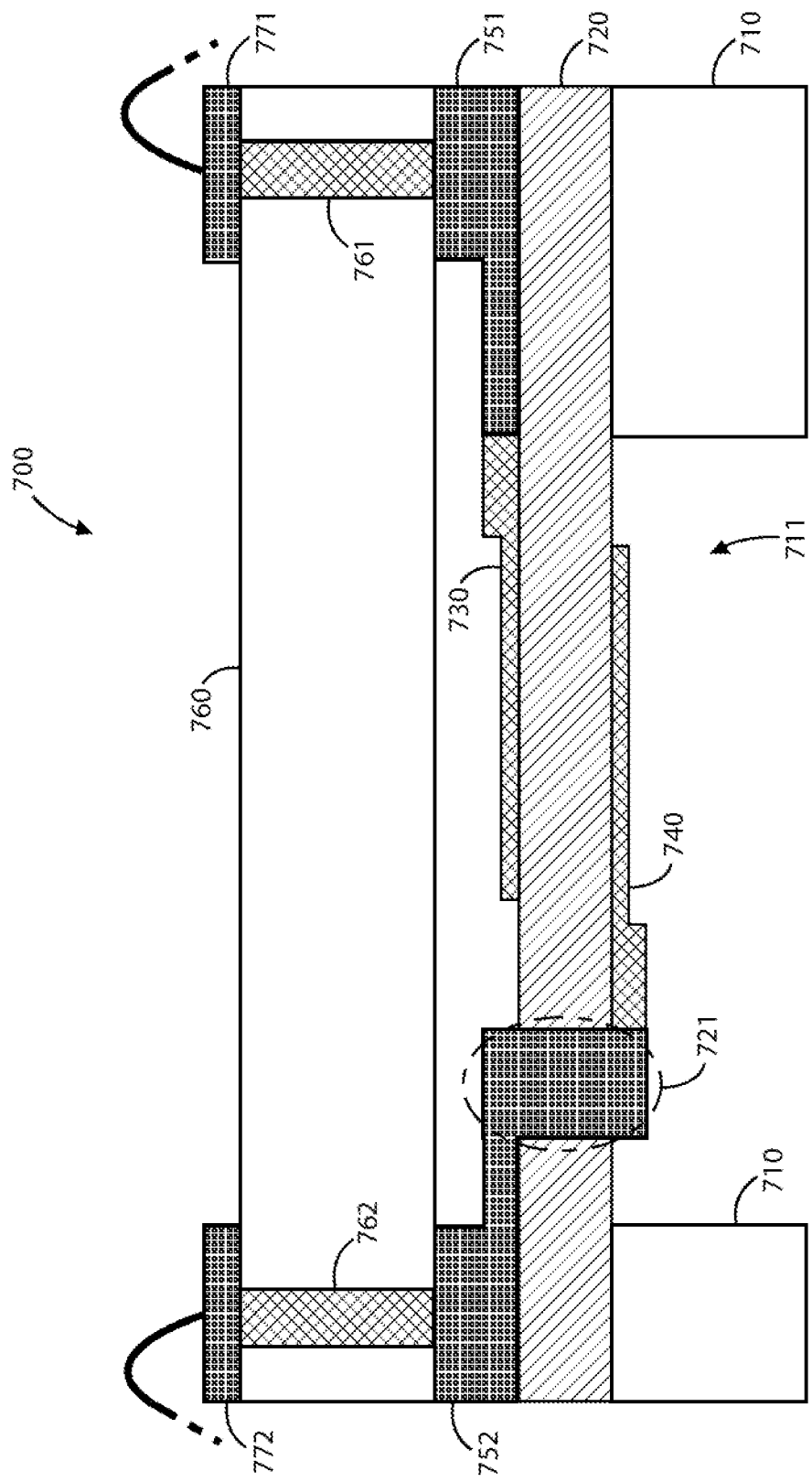
FIG. 7 is a simplified diagram illustrating a cross-sectional view of an RF filter circuit according to an example of the present invention.

FIG. 7 is a simplified diagram illustrating a cross-sectional view of an RF filter circuit device according to an example of the present invention. As shown, device 700 includes a resonator device having a piezoelectric layer 720 formed overlying a substrate 710. This resonator device includes a front-side electrode 730 and a back-side electrode 740 coupled to the top and bottom surface regions of the piezoelectric layer 720, respectively. The piezoelectric layer 720 and the electrodes 730, 740 are spatially configured overlying a cavity region 711 of the substrate 710.

Device 700 further shows an example of the resonator device electrical connections and packaging configuration. The front-side electrode 730 can be electrically coupled by metallization to a first bond pad 751. The piezoelectric layer 720 can have a metal micro-via configured through a portion that is electrically coupled to the back-side electrode 740 and a second bond pad 752.

In an example, device 700 can further include a cap layer 760 formed overlying the resonator device. The cap layer 760 can have vias 761, 762 that are electrically coupled to the first and second bond pads 751, 752, respectively. These vias 761, 762 can also be electrically coupled to cap bond pads 771, 772, which can be connected to other circuit components by wire bonding, solder bonding, or the like. There can be other variations, modifications, and alternatives.

Figures 8A, 8B, 8C:
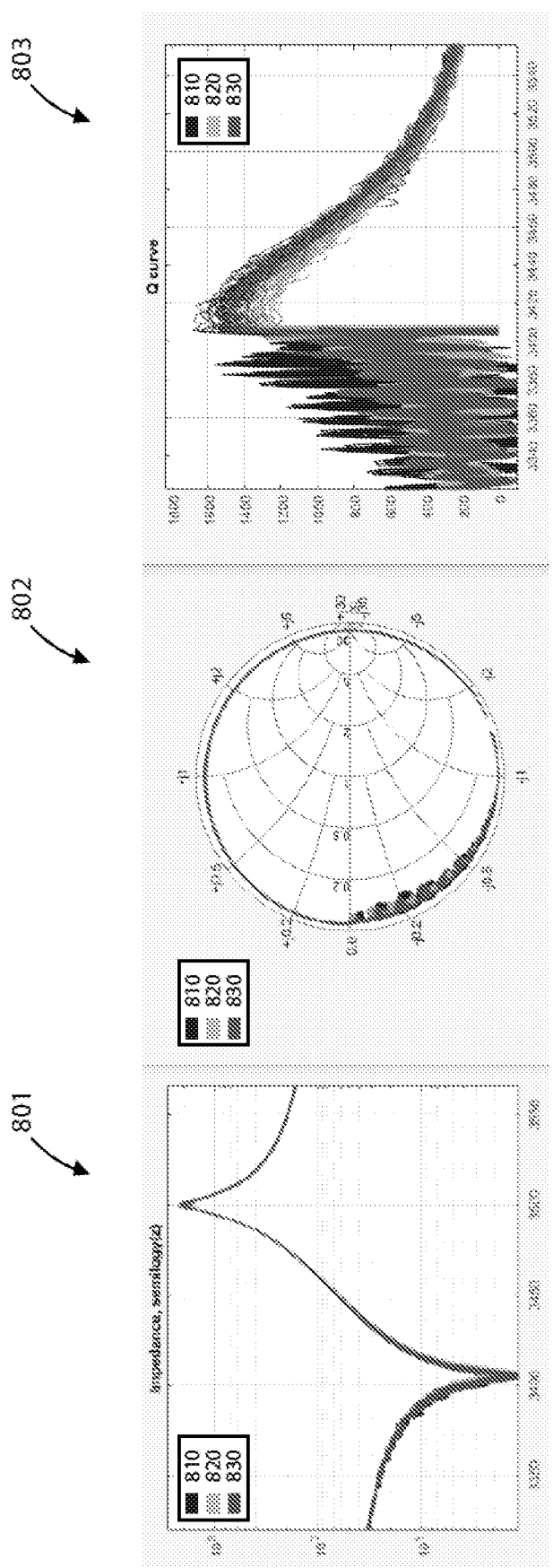
FIGS. 8A-8C are data plots comparing results between a conventional elliptical resonator, a conventional quadrilateral-shaped resonator, and an egg-shaped resonator according to an example of the present invention.

FIGS. 8A-8C are data plots comparing results between a conventional elliptical resonator, a conventional quadrilateral-shaped resonator, and an egg-shaped resonator according to an example of the present invention. A color legend is provided on each of these figures showing which data plots represent the elliptical resonator 810, the quadrilateral-shaped resonator 820, and the full egg-shaped resonator 830 (similar to the resonator of FIG. 3A). For each of the tested resonators, FIG. 8A shows an impedance profile 801, FIG. 8B shows a Smith Chart 802, and FIG. 8C shows a quality factor (Q) curve 803 measured over frequency. Each of these plots shows the results from many dies over a wafer. These results indicate that the full egg-shaped resonator 830 gives less spurious modes below $F_s$ and gives better $Q_p$.

Figures 9A, 9B:
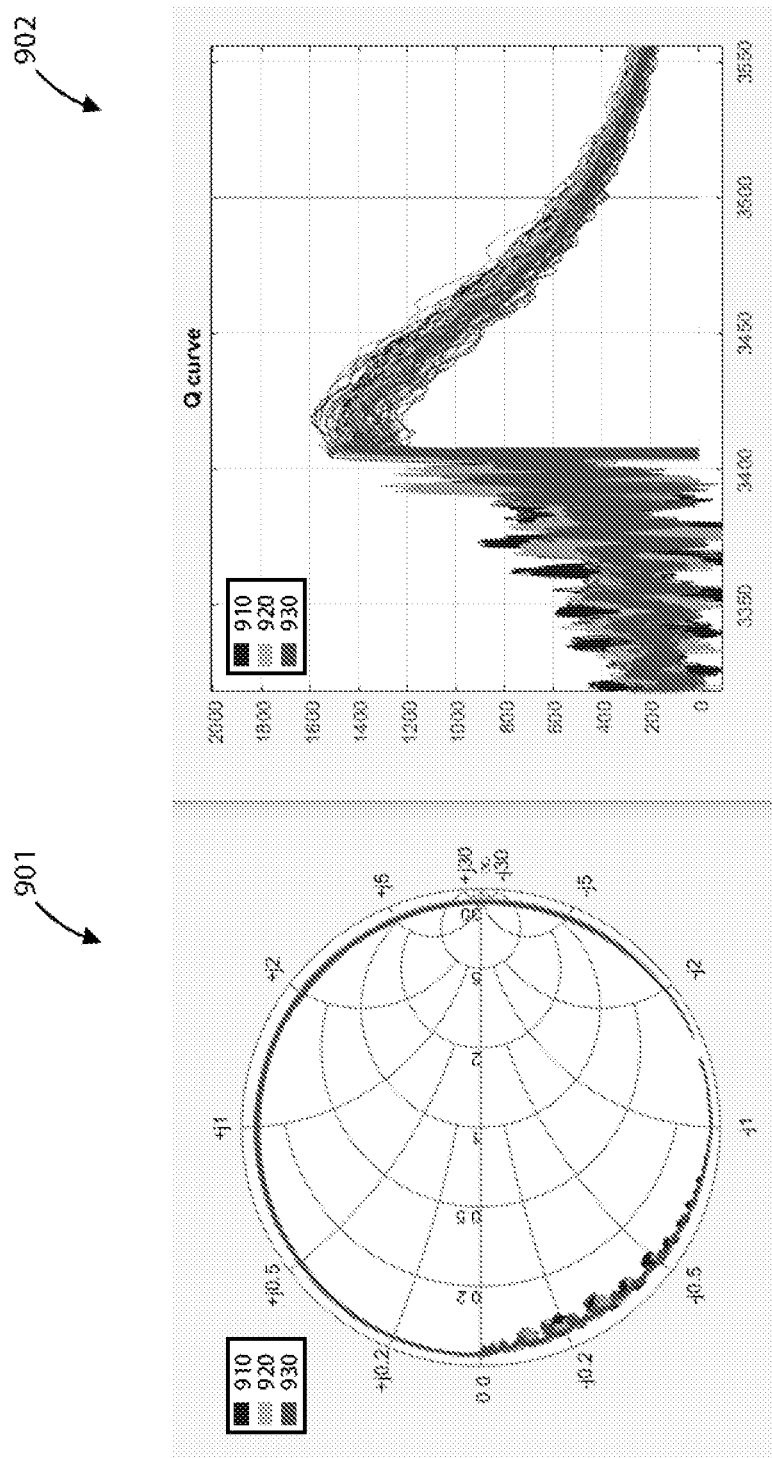
FIGS. 9A-9B are data plots comparing results between a full egg-shaped resonator, a first half egg-shaped resonator, and a second half egg-shaped resonator according to examples of the present invention.

FIGS. 9A-9B are data plots comparing results between a full egg-shaped resonator, a first half egg-shaped resonator, and a second half egg-shaped resonator according to examples of the present invention. Similar to FIGS. 8A-8C, a color legend is provided on each of these figures showing which data plots represent the egg-shaped resonator 910 (similar to the resonator of FIG. 3A), the first half egg-shaped resonator 920 (similar to the resonator of FIG. 3B), and the second half egg-shaped resonator 930 (similar to the resonator of FIG. 3C). For each of the tested resonators, FIG. 9A shows a Smith Chart 901 and FIG. 9B shows a Q curve 902 measured over frequency. These results show that the first half egg-shaped resonator 920 gives less spurious modes than the full egg-shaped resonator 910, and that the second half egg-shaped resonator 930 gives the least spurious modes yet giving slightly less $Q_p$ and $Q_s$.

Figures 10A, 10B:
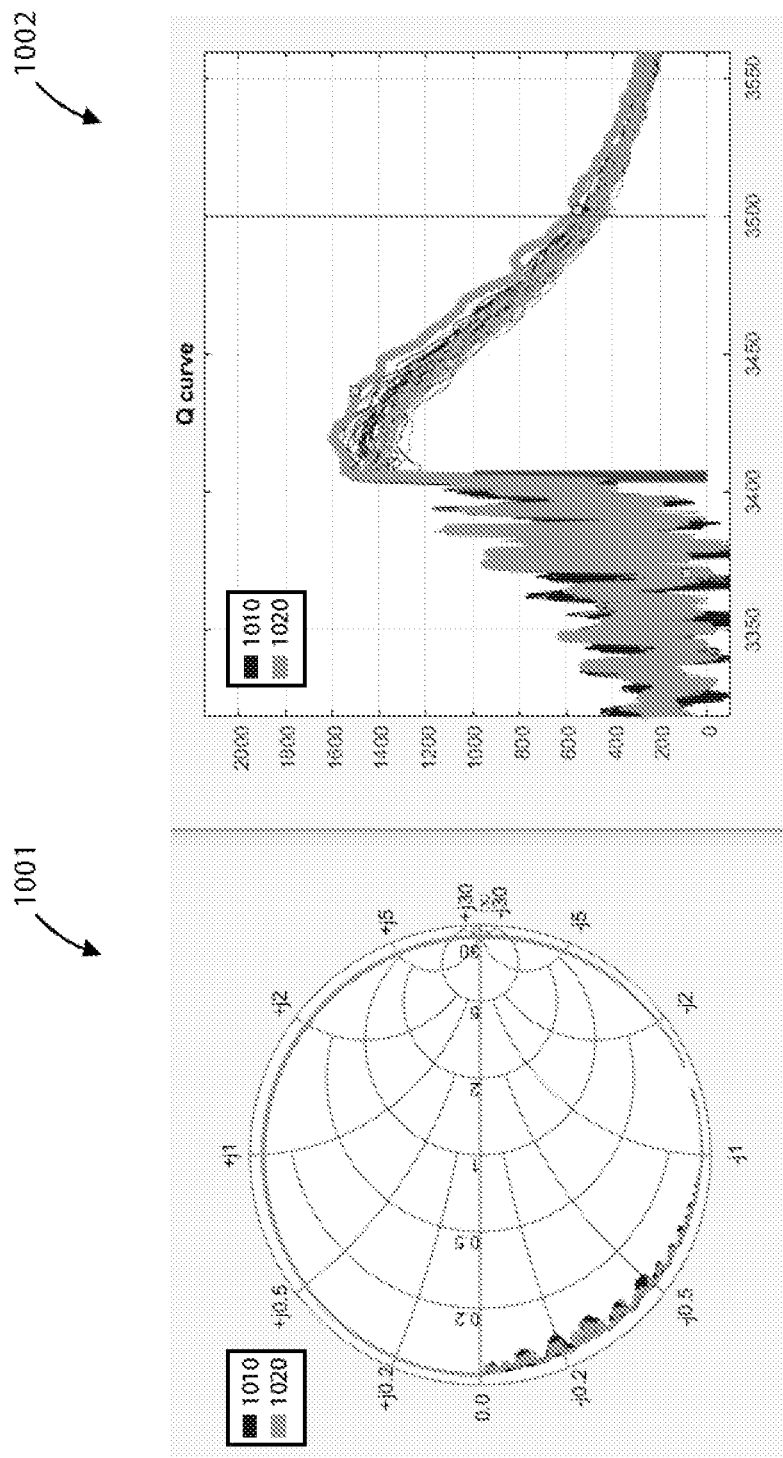
FIGS. 10A-10B are data plots comparing results between a full egg-shaped resonator and an asymmetrical half egg-shaped resonator according to examples of the present invention.

FIGS. 10A-10B are data plots comparing results between a full egg-shaped resonator and an asymmetrical half egg-shaped resonator according to examples of the present invention. Similar to the previous data result figures, a color legend is provided on each of these figures showing which data plots represent full egg-shaped resonator 1010 (similar to the resonator of FIG. 3A) and the asymmetrical half egg-shaped resonator 1020 (similar to the resonator of FIG. 4A). For each of the tested resonators, FIG. 10A shows a Smith Chart 1001, and FIG. 10B shows a Q curve 1002 measured over frequency. As the results show, both gives less spurious modes below $F_s$ and good $Q_p$.

Figures 11A, 11B, 11C:
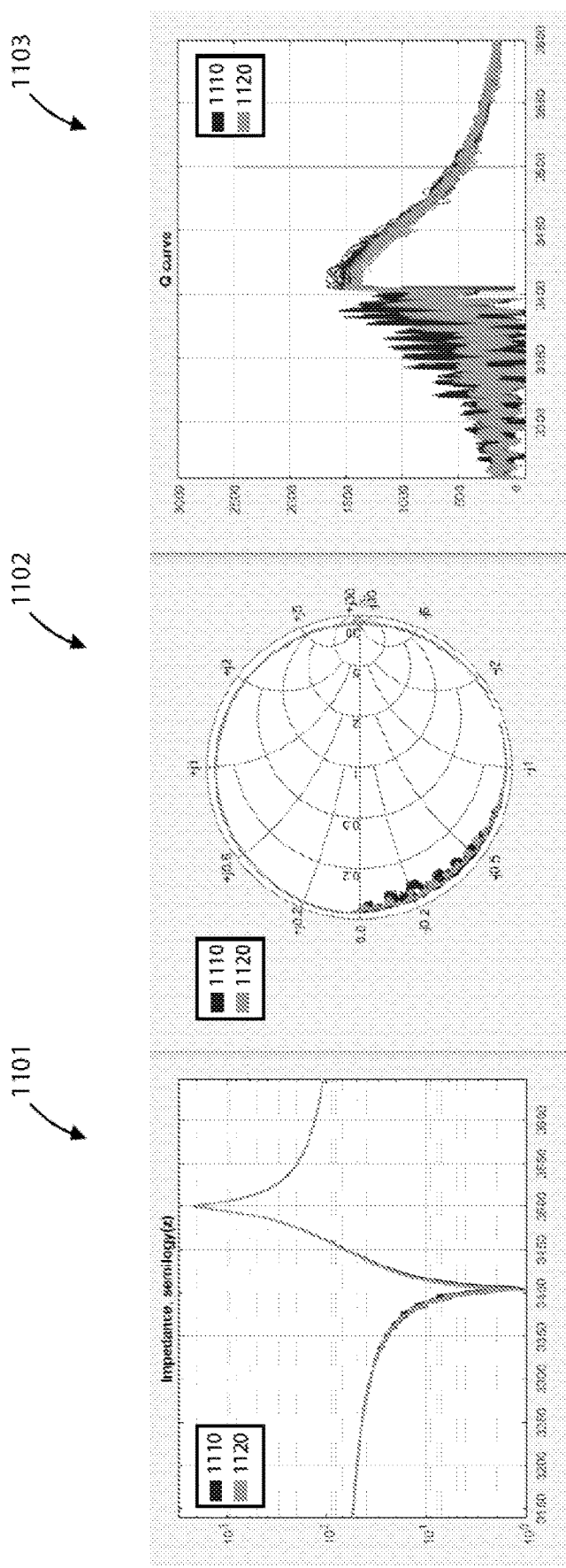
FIGS. 11A-11C are data plots comparing results between a conventional elliptical resonator and a combination shape resonator according to an example of the present invention.

FIGS. 11A-11C are data plots comparing results between a conventional elliptical resonator and a combination shape resonator according to an example of the present invention. Similar to the previous data results figures, a color legend is provided on each of these figures showing which data plots represent the elliptical resonator 1110 and the combination shape resonator 1120. For each of the tested resonators, FIG. 11A shows an impedance profile 1101, FIG. 11B shows a Smith Chart 1102, and FIG. 11C shows a Q curve 1103 measured over frequency.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. A resonator circuit device comprising:
a top electrode;
a piezoelectric layer; and
a bottom electrode;
wherein the top electrode, the piezoelectric layer, and the bottom electrode are characterized by a portion of an oval shape with only a single axis of symmetry, and
wherein the portion of the oval shape with only a single axis of symmetry is characterized by a complete oval shape with only a single axis of symmetry.

2. The device of claim 1, wherein the top electrode and bottom electrode include molybdenum (Mo), ruthenium (Ru), tungsten (W), or aluminum-copper (AlCu).

3. The device of claim 1, wherein the piezoelectric layer includes materials or alloys having at least one of the following: AlN, AlGaN, GaN, InN, InGaN, AlInN, AlInGaN, ScAlN, ScGaN, AlScYN, and BN.

4. A resonator circuit device comprising:
a top electrode;
a piezoelectric layer; and
a bottom electrode;
wherein the top electrode, the piezoelectric layer, and the bottom electrode are characterized by a portion of an oval shape with only a single axis of symmetry,
wherein the portion of the oval shape with only one axis of symmetry is characterized by a portion having a non-zero angle α from an axis perpendicular to the axis of symmetry, and
wherein the non-zero angle α ranges from about −30 degrees to about 30 degrees.

5. A resonator circuit device comprising:
a top electrode;
a piezoelectric layer; and
a bottom electrode;
wherein the top electrode, the piezoelectric layer, and the bottom electrode are characterized by a portion of an oval shape with only a single axis of symmetry, and
wherein the top electrode, the piezoelectric layer, and the bottom electrode are characterized by a portion of an asymmetrical egg shape, the asymmetrical egg shape being subjected to a skew.

6. The device of claim 5, wherein the asymmetrical egg shape being subjected to a skew is characterized by a portion having a non-zero angle α from an axis perpendicular to the axis of symmetry.

7. The device of claim 4, wherein the top electrode and bottom electrode include molybdenum (Mo), ruthenium (Ru), tungsten (W), or aluminum-copper (AlCu).

8. The device of claim 4, wherein the piezoelectric layer includes materials or alloys having at least one of the following: AlN, AlGaN, GaN, InN, InGaN, AlInN, AlInGaN, ScAlN, ScGaN, AlScYN, and BN.

9. The device of claim 5, wherein the top electrode and bottom electrode include molybdenum (Mo), ruthenium (Ru), tungsten (W), or aluminum-copper (AlCu).

10. The device of claim 5, wherein the piezoelectric layer includes materials or alloys having at least one of the following: AlN, AlGaN, GaN, InN, InGaN, AlInN, AlInGaN, ScAlN, ScGaN, AlScYN, and BN.

* * * * *